US012760407B2

(12) United States Patent
Nakamitsu

(10) Patent No.: US 12,760,407 B2
(45) Date of Patent: Oct. 13, 2026

(54) SPUTTERING APPARATUS AND DEPOSITION METHOD OF TUNGSTEN FILM

(71) Applicant: ULVAC, INC., Kanagawa (JP)

(72) Inventor: Yutaka Nakamitsu, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 19/189,640

(22) Filed: Apr. 25, 2025

(65) Prior Publication Data

US 2026/0002252 A1 Jan. 1, 2026

(30) Foreign Application Priority Data

Jul. 1, 2024 (JP) ................................ 2024-106387

(51) Int. Cl.
*C23C 14/34* (2006.01)
*C23C 14/14* (2006.01)
*C23C 14/50* (2006.01)
*H01J 37/34* (2006.01)
*H10P 14/40* (2026.01)

(52) U.S. Cl.
CPC .......... *C23C 14/3435* (2013.01); *C23C 14/14* (2013.01); *C23C 14/3407* (2013.01); *C23C 14/50* (2013.01); *H01J 37/3441* (2013.01); *H01J 2237/332* (2013.01); *H10P 14/418* (2026.01)

(58) Field of Classification Search
CPC . C23C 14/3435; C23C 14/14; C23C 14/3407; C23C 14/50; C23C 14/165; C23C 14/345; C23C 14/35; C23C 14/185; C23C 14/228; C23C 14/54; C23C 14/564; H01J 37/3441; H01J 2237/332; H10P 14/418
See application file for complete search history.

(56) References Cited

U.S. PATENT DOCUMENTS 5,605,637 A * 2/1997 Shan ................ H01J 37/32477
156/345.47
2006/0172536 A1* 8/2006 Brown ................ H01J 37/3408
438/687

(Continued)

FOREIGN PATENT DOCUMENTS

JP 2014-107470 A 6/2014

*Primary Examiner* — Patrick S Ott
(74) *Attorney, Agent, or Firm* — Future IP LLC; Tomoko Nakajima

(57) ABSTRACT

A substrate stage holding a substrate to be treated in a vacuum chamber in which a target made of tungsten is mounted and a high-frequency power source supplying a high-frequency electric power to the substrate stage are provided. When a first plasma atmosphere is generated in the vacuum chamber, and sputtered particles generated by sputtering the target are adhered and accumulated on the substrate so that a tungsten film is deposited, a second plasma atmosphere is generated by supplying the high-frequency electric power to the substrate stage, and plus ions in the first plasma atmosphere are also caused to collide with the substrate. Provided that an area of a substrate holding surface of the substrate stage functioning as one electrode and an inner-surface area of the vacuum chamber functioning as the other electrode of the second plasma atmosphere are defined as an anode area and a cathode area, respectively.

2 Claims, 2 Drawing Sheets

(56) References Cited

U.S. PATENT DOCUMENTS

| | | | | |
|---|---|---|---|---|
| 2007/0051471 | A1* | 3/2007 | Kawaguchi | H10P 72/0421 156/345.36 |
| 2007/0072434 | A1* | 3/2007 | Wen | C23C 14/35 438/727 |
| 2012/0247949 | A1* | 10/2012 | Sakuma | H10P 14/44 204/192.15 |

* cited by examiner

SPUTTERING APPARATUS AND DEPOSITION METHOD OF TUNGSTEN FILM

This application claims priority under 35 U.S.C. § 119 to Japanese Patent Application No. 2024-106387, filed Jul. 1, 2024, which is incorporated by reference.

TECHNICAL FIELD

The invention relates to a sputtering apparatus for depositing a tungsten film by a sputtering method and a deposition method of a tungsten film.

BACKGROUND ART

For example, it has been known that low resistance is required for the tungsten film used as a wiring layer of a semiconductor device, and as a crystal grain of the tungsten film becomes large, a specific resistance value becomes small. In general, although a sputtering apparatus is used to deposit the tungsten film, a melting point of tungsten is extremely high (about 3,400° C.). Therefore, at the time of deposition by a sputtering of a target made of tungsten, the crystal grain is to be made to grow and a low-resistance tungsten film is intended to be formed, it is necessary that a substrate to be treated (hereafter also referred to as "substrate"), such as a silicon wafer on which the tungsten film is to deposited, is at a relatively high temperature.

It has been conventionally known by Patent Document No. 1 that during deposition, a high-frequency electric power is supplied to a substrate stage holding the substrate in a vacuum chamber and functioning as one electrode (cathode electrode), and a second plasma atmosphere of a capacity-coupling type is generated in the vacuum chamber. Due to the second plasma atmosphere, plus ions ($Ar^+$ or $Kr^+$) of a rare gas (argon gas or krypton gas), which are ionized in a first plasma atmosphere, are caused to collide with a deposition surface (tungsten film) of the substrate, thereby effectively raising a substrate temperature at the time of deposition due to the so-called an ion-assist effect. However, if the ion-assist effect is made too strong, the tungsten film deposited on the substrate surface is damaged. Accordingly, a challenge is to make the most of using the ion-assist effect without damaging the tungsten film, and to meet this challenge, it is important that even if the high-frequency electric power is increased, a self-bias potential, which is a negative DC component of a substrate potential when the high-frequency electric power is supplied, does not become excessive.

The ion-assist effect can be considered as a product obtained by multiplying a flux (number) of the plus ions colliding with the substrate and a kinetic energy of the plus ions. The flux of the plus ions relates to a plasma density of the second plasma atmosphere generated in a region near the substrate side in a deposition space, and the flux of the plus ion colliding with the substrate can be increased by a higher plasma density. The plasma density of the second plasma atmosphere depends mainly on the high-frequency electric power supplied to the substrate stage. On the other hand, the kinetic energy of the plus ions relates to the self-bias potential, and the kinetic energy of the plus ions colliding with the substrate surface is increased by a higher self-bias potential. If the kinetic energy is excessive, the grain of the tungsten film is destroyed, or the plus ions come in the tungsten film, causing the specific resistance value to increase.

REFERENCE

Patent Document No. 1: JP2014-107470 A

SUMMARY OF INVENTION

Technical Problems

In light of the foregoing problems, the invention provides a sputtering apparatus and a deposition method of a tungsten film, which when a high-frequency electric power supplied to a substrate stage is increased, a self-bias potential does not become excessive and a low-resistance tungsten film is deposited by making the most of using an ion-assist effect.

Solution to Problems

In order to solve the foregoing problems, a sputtering apparatus of the invention, including: a substrate stage holding a substrate to be treated in a vacuum chamber in which a target made of tungsten is mounted; and a high-frequency power source supplying a high-frequency electric power to the substrate stage, wherein the sputtering apparatus is configured that when a first plasma atmosphere of a rare gas is generated in the vacuum chamber of a vacuum atmosphere, and sputtered particles generated by sputtering the target are adhered and accumulated on the substrate to be treated held by a substrate holding surface of the substrate stage so that a tungsten film is deposited, a second plasma atmosphere of capacity-coupling type is generated in the vacuum chamber by supplying the high-frequency electric power to the substrate stage functioning as one electrode, and plus ions ionized in the first plasma atmosphere are also caused to collide with the substrate to be treated, and wherein the sputtering apparatus is further configured that provided that an area of the substrate holding surface of the substrate stage to which the high-frequency electric power is supplied is defined as a cathode area and an inner-surface area of the vacuum chamber functioning as the other electrode of the second plasma atmosphere is defined as an anode area, a ratio of the anode area to the cathode area is set in a range of 4.0 to 6.0.

In addition, in order to the foregoing problem, a deposition method of a tungsten film of the invention, including: a step of introducing a rare gas into a vacuum chamber in which a target made of tungsten is mounted, generating a first plasma atmosphere of the rare gas in the vacuum chamber of a vacuum atmosphere by supplying an electric power to the target, scattering sputtered particles generated by sputtering a sputtering surface of the target, and depositing a tungsten film by adhering and accumulating the sputtered particles on a substrate to be treated held by a substrate stage; and a step, during deposition, of supplying a high-frequency electric power to the substrate stage functioning as one electrode and generating a second plasma atmosphere of a capacity-coupling type in the vacuum chamber, and also causing ions ionized in the first plasma atmosphere to collide with the substrate to be treated, wherein provided that an area of a substrate holding surface of the substrate stage to which the high-frequency electric power is supplied is defined as a cathode area and an inner-surface area of the vacuum chamber functioning as the other electrode of the second plasma atmosphere is defined as an anode area, the deposition method of the tungsten film further comprises a step of adjusting a self-bias potential that is a negative DC component of a potential of the substrate to be treated independently of the high-frequency electric power supplied to the substrate stage by changing a ratio of the anode area to the cathode area in a range of 4.0 to 6.0.

Meanwhile, it has been known that the self-bias potential (VDC) is represented by the following Formula 1.

$$V_{DC} = \frac{C_K - C_A}{C_K + C_A} V_{RF} \quad \text{[Formula 1]}$$

In Formula 1, $V_{RF}$ represents a $V_{PP}$ value of the high-frequency power source, and $(C_K-C_A)/(C_K+C_A)$ represents a capacity of an ion sheath formed on each of surfaces of one electrode (cathode electrode) and the other electrode (anode electrode). The capacity of the ion sheath greatly depends on the surfaces of the electrodes. Accordingly, if the $V_{PP}$ value of the high-frequency power source is reduced, the $V_{DC}$ can be reduced. Since the $V_{PP}$ value depends on a load impedance during deposition, if the load impedance can be reduced, the $V_{PP}$ value is reduced, and consequently the $V_{DD}$ can be reduced. On the other hand, the high-frequency electric power supplied from the high-frequency power source to the substrate stage, which functions as one electrode (cathode electrode), can be considered to return the high-frequency power source from portions at a ground potential, which functions as the other electrode (anode electrode) and exists in the vacuum chamber, i.e., for example, the target and a shield unit at the ground potential surrounding a deposition space between the target and the substrate stage, via the second plasma atmosphere. A circuit flowing from the anode electrode to the high-frequency power source is hereafter referred to as a “return circuit”. As a result, the load impedance, as viewed from the high-frequency power source, is mainly composed of a plasma impedance of the second plasma atmosphere and an impedance in the return circuit.

Based on the above, after focusing on an area ratio of the cathode electrode and the anode electrode and making diligent researches, when the ratio of the anode area to the cathode area is set in a range of 4.0 to 6.0, even though the high-frequency power source supplied to the substrate stage is increased, it was concluded that the self-bias potential does not become excessive, and while suppressing damage to the tungsten film, a low-resistance tungsten film can be deposited. In other words, in the invention, corresponding to the ratio of the anode area to the cathode area, the self-bias potential that is a negative DC component of the substrate potential is adjusted independently of the high-frequency electric power supplied to the substrate stage, the highly dense second plasma atmosphere is generated in a deposition space close to the substrate to be treated by supplying a relatively high high-frequency electric power, and the plus ions are accelerated by an optimal self-bias potential and made to collide with the substrate to be treated. Accordingly, the low-resistance tungsten film can be deposited by making the most of using an ion-assist effect. It should be noted that when the ratio of the anode area to the cathode area is greater than 6.0, it becomes difficult to adjust the self-bias potential independently of the high-frequency electric power and the damage to the tungsten film caused by plus ions increases. On the other hand, when the ratio of the anode area to the cathode area is less than 4.0, even though the high-frequency electric power supplied to the substrate stage is increased, the plasma density of the second plasma atmosphere cannot be sufficiently enhanced (i.e., the flux of the plus ions does not increase sufficiently), the crystal grain of the tungsten cannot be made to grow by the ion-assist effect.

In a case where the sputtering apparatus further includes a shield unit at a ground potential, which surrounds a deposition space between the target and the substrate stage, and the shield unit functions as the other electrode, the following configuration can be adopted. The shield unit has a shield plate placed around the substrate stage, in a surface of the shield plate facing the deposition space, a first surface placed on the substrate stage side has a low impedance value compared to a second surface portion other than the first surface portion, and the anode area is caused to decrease. In this case, a configuration in which an insulator is placed on the second surface portion and the second surface portion is covered with the insulator may be adopted. According to the configuration, the configuration in which an existing sputtering apparatus is used and the ratio of the anode area to the cathode is set in the predetermined range as described above can be achieved, which is advantageous. It should be noted that when an area of the first surface portion that is placed on the substrate stage side in the surface of the shield plate facing the deposition space is made to decrease, it is confirmed that a film thickness of the tungsten film on an outer-edge side of the substrate is decreased and in-plane uniformity of the film thickness deteriorates compared to a case in which an area of the second surface area other than the first surface portion is made to decrease. The reason for this can be considered that when the second plasma is generated in the deposition space, although the plasma atmosphere of the capacity-coupling type is also generated locally between the substrate stage and the shield plate of the shield unit, when the anode area of the first surface portion is made to decrease, the impedance becomes high and the plasma density of the locally generated plasma atmosphere is decreased. In contrast, when the above configuration is adopted, the decrease of the film thickness on the outer-edge side of the substrate can be suppressed and the in-plane uniformity of the film thickness can be improved.

DESCRIPTION OF EMBODIMENTS

Now, referring to figures, an embodiment of a sputtering apparatus and a deposition method of a tungsten film of the invention will be described, for example, using a case in which an article (hereinafter, referred to as “substrate Sw”) having a $SiO_2$ film of a predetermined film thickness deposited on a silicon wafer is made a substrate to be treated, and a tungsten film is deposited on a deposition surface Sw1 of the substrate Sw by the so-called deposition-down manner.

Figure 1A:
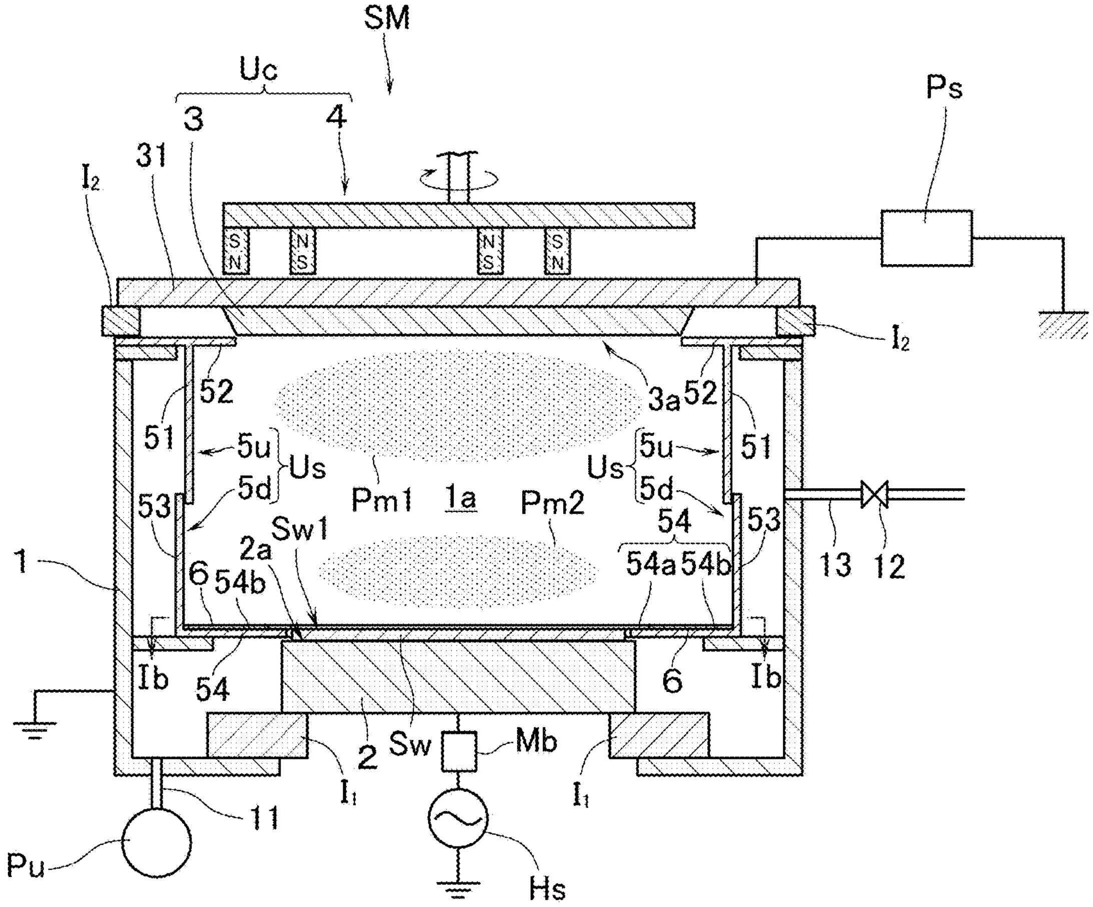
FIG. 1A is a schematic cross-section of a sputtering apparatus of an embodiment.

With reference to FIG. 1, SM is a sputtering apparatus of a magnetron type of the embodiment and includes a vacuum chamber 1 capable of forming a vacuum atmosphere. An exhaust pipe 11 communicating with a vacuum pump unit Pu composed of a turbo-molecular pump or a dry pump is connected to a lower wall of the vacuum chamber 1, and an interior of the vacuum chamber 1 can be evacuated to vacuum. In addition, a gas pipe 13 to which a mass flow controller 12 is interposed is connected to a side wall of the vacuum chamber 1, and a rare gas (for example, argon gas and krypton gas) can be introduced into the vacuum chamber 1 at a predetermined rate during a vacuum atmosphere. A substrate stage 2 holding the substrate Sw is provided at an inner surface of the lower wall of the vacuum chamber 1. The substrate stage 2 is placed on the lower wall through an insulator $I_1$, and the substrate Sw is positioned and held in a state in which a deposition surface Sw1 faces upward. In addition, an output from a high-frequency power source Hs is connected to the substrate stage 2 by a coaxial cable through a matching box Mb, and a high-frequency electric power of a predetermined frequency (2 to 27 MHz) can be supplied to the substrate stage 2. It should be noted that, although not specifically illustrated and described, a heater of a resistance heating type is incorporated in the substrate stage 2, and that the substrate Sw can be heated in a predetermined range (for example, 100° C. to 400° C.). In addition, a cathode unit Uc is provided with an upper part of the vacuum chamber 1.

The cathode unit Uc has a target 3 made of tungsten of a predetermined purity (for example, 99.99 wt %) that is placed opposite to the substrate Sw, and a magnet unit 4 that is positioned outside of the vacuum chamber 1 and operates a leakage magnetic field that penetrates the target 3 to a deposition space 1*a*. Since the magnet unit 4 can be used from the conventional ones, the detailed description of the magnet unit 4 is omitted. The target 3 has a shape (circular shape in a plan view) corresponding to a contour of the substrate Sw and an area of a size larger than the substrate Sw. A backing plate 31 is mounted on one surface of the target 3. Furthermore, the target 3 is detachably attached to the vacuum chamber 1 in a state in which an insulator $I_2$ is interposed at a portion of the backing plate 31 expanding outward from the target 3. An output from a DC power source Ps is connected to the target 3, a predetermined DC power with a negative potential can be supplied to the target 3. A shield unit Us surrounding the deposition space 1*a* between the substrate stage 2 and the target 3 is provided in the vacuum chamber 1.

The shield unit Us includes an upper shield plate 5*u* and a lower shield plate 5*d*, each of which is made of a conductive material such as stainless steel, and is electrically connected to the vacuum chamber 1 at a ground potential. The upper shield plate 5*u* has a tubular body part 51 surrounding a part of the deposition space 1*a* and an upper flat plate part 52 formed by bending an upper end part of the body part 51 toward an inside of the vacuum chamber 1. In an attached state of the upper shield plate 5*u* to the vacuum chamber 1, the upper flat plate part 52 is positioned around the target 3 with a clearance and in a posture in which the upper flat plate part 52 and a sputtering surface 3*a* at the time of non-use are approximately flat. The lower shield plate 5*d* has a tubular body part 53 surrounding a part of the deposition space 1*a* and a lower flat plate part 54 formed by bending a lower end part of the body part 51 toward the inside of the vacuum chamber 1. In an attached state of the lower shield plate 5*d* to the vacuum chamber 1, the lower flat plate part 54 is positioned around the substrate stage 2 with a clearance and in a posture in which the lower flat plate part 54 and a substrate holding surface 2*a* of the substrate stage 2 are approximately flat. In addition, an upper end part of the body part 53 of the lower shield plate 5*d* overlaps a lower end part of the body part 51 of the upper shield plate 5*u* over a predetermined length in a perpendicular direction so that sputtered particles are suppressed from stealing out of the deposition space 1*a*. It should be noted that although as an upper shield plate 5*u* and a lower shield plate 5*d*, the upper flat plate part 52 and the lower flat plate part 54 are integrally formed in the embodiment, the upper flat plate part 52 and the lower flat plate part 54 are not limited to the integral formation but can be formed individually. In addition, a shape of a surface of the lower flat plate part 54 of the lower shield plate 5*d* is not limited to a flat shape, but a convex surface curved upward and a surface inclined downward and directed to the outside of the vacuum chamber 1 are also included.

In a case where a tungsten film is deposited on the substrate Sw, the rare gas (argon gas and krypton gas) of which a flow rate is controlled is introduced into the vacuum chamber 1 of the vacuum atmosphere (a pressure in the vacuum chamber 1 is, for example, in a range of 0.1 Pa to 3.0 Pa), and the predetermined electric power (for example, in a range of 0.5 kW to 1.5 kW, depending on the area of the sputtering surface 3*a*) is supplied to the target 3. As a result, a first plasma atmosphere Pm1 of the rare gas is generated in the vacuum chamber 1, and plus ions ($Ar^+$ and $Kr^+$) ionized in the first plasma atmosphere Pm collide with the sputtering surface 3*a* of the target 3. Subsequently, the sputtered particles generated by the sputtering of the target 3 adhere and accumulate on the deposition surface Sw1 of the substrate Sw held by the substrate holding surface 2*a* of the substrate stage 2, and the tungsten film is deposited. During deposition of the tungsten film, the high-frequency electric power (for example, in the range of 200 W to 1,200 W) is supplied from the high-frequency power source Hs to the substrate stage 2 so as to generate a second plasma atmosphere Pm2 of the capacity-coupling type and also to make the plus ions ($Ar^+$ and $Kr^+$) ionized in the first plasma atmosphere Pm1 collide with the deposition surface Sw1 of the substrate Sw. In this case, the substrate stage 2 to which the high-frequency electric power is supplied functions as one electrode (cathode electrode), that attracts the plus ions ionized in the first plasma atmosphere Pm1, and the target 3 and the shield unit Us at a ground potential functions as the other electrode (anode electrode). In other words, the anode area can be represented by a sum of a surface area of the sputtering surface 3*a* of the target 3 and an inner-surface area of the shield unit Us facing the deposition space 1*a*. Therefore, the substrate temperature during deposition can be effectively enhanced by the ion-assist effect that causes the plus ions to collide with the deposition surface Sw1 of the substrate Sw. However, the ion-assist effect should be made the most so as not to damage the tungsten film.

Figure 1B:
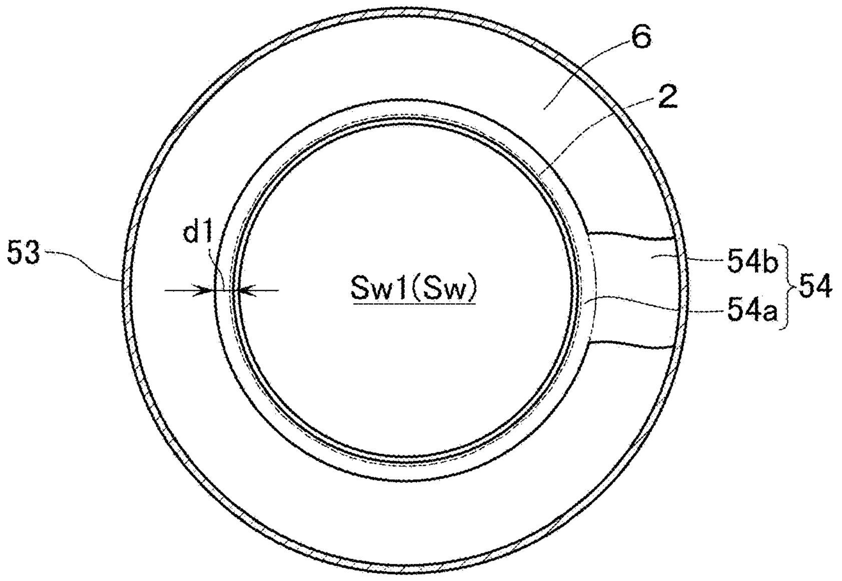
FIG. 1B is a cross-section of FIG. 1A along a Ib-Ib line.

In the embodiment, focusing on a plasma impedance of the second plasma atmosphere Pm2, an area of the substrate holding surface 2*a* of the substrate stage 2 to which the high-frequency electric power is supplied from the high-frequency power source Hs is made a cathode area, and provided that the substrate stage 2 is made one electrode (cathode electrode), an inner-surface area of the vacuum chamber 1 that functions as the other electrode (anode area) of the second plasma atmosphere 2 is made an anode area. The ratio of the anode area to the cathode area is set in a range of 4.0 to 6.0. Specifically, as shown in FIG. 1B, the surface of the lower flat plate part 54 facing the deposition space 1*a* is divided into two concentrical regions, i.e., a first surface portion 54*a* placed on a side of the substrate stage 2 and a second surface portion 54*b* other than the first surface portion 54*a*, and the second surface portion 54*b* is covered with an insulator 6 so that the second surface portion 54*b* has a relatively high impedance value. This causes the second surface portion 54*b* to be a portion that does not function as an anode electrode, thereby reducing the anode area substantially. For example, a foil-or plate-shaped article made of alumina can be used as an insulator 6. A distance d1, which regulates a surface portion functioning as an anode electrode, from an inner-edge part of the lower flat plate part 54 to a circle forming an interface between the first surface portion 54*a* and the second surface portion 54*b* is set in consideration of deposition results such as the ratio of the anode area to the cathode area and distribution of a film thickness. It should be noted that since a plasma density of the second plasma atmosphere Pm2 also depends on a Dc power supplied to the target 3 and a strength of a magnetic field acted by the magnet unit 4, the ratio of the anode area to the cathode area must change in consideration of these matters.

According to the embodiment, even though the high-frequency electric power supplied to the substrate stage 2 during deposition is increased, the self-bias potential does not become excessive, and while suppressing the damage to the tungsten film, the low-resistance tungsten film can be deposited. A highly dense second plasma atmosphere is generated in the deposition space 1*a* close to the substrate Sw to which a relatively high high-frequency electric power is supplied, and the plus ions are accelerated by an optimal self-bias potential to collide with the substrate Sw, thereby depositing the low-resistance tungsten film by making the most of using the ion-assist effect. It should be noted that when the ratio of the anode area to the cathode area is greater than 6.0, it is difficult to adjust the self-bias potential independently of the high-frequency electric power, and the damage to the tungsten film by the plus ions is increased. On the other hand, when the ratio of the anode area to the cathode area is less than 4.0, a surface of the shield unit Us facing the deposition space 1*a* is sputtered, and in a case where the second plasma atmosphere Pm2 is generated by supplying the high-frequency electric power of a high electric power (for example, 650 W or more), a defect that is a plasma leakage toward an outside of the shield unit Us occurs, and even though the high-frequency electric power supplied to the substrate stage 2 is increased, the plasma density of the second plasma atmosphere Pm2 cannot be sufficiently enhanced and a crystal grain of the tungsten film cannot be grown. In addition, since the anode area is decreased by covering the second surface portion 54*b* of the lower flat plate part 54 with the insulator 6, this configuration can be easily adopted to an existing sputtering apparatus, and decrease of the film thickness on a side of the outer edge part of the substrate Sw is suppressed so that in-plane uniformity of the film thickness can be improved.

Figure 2A:
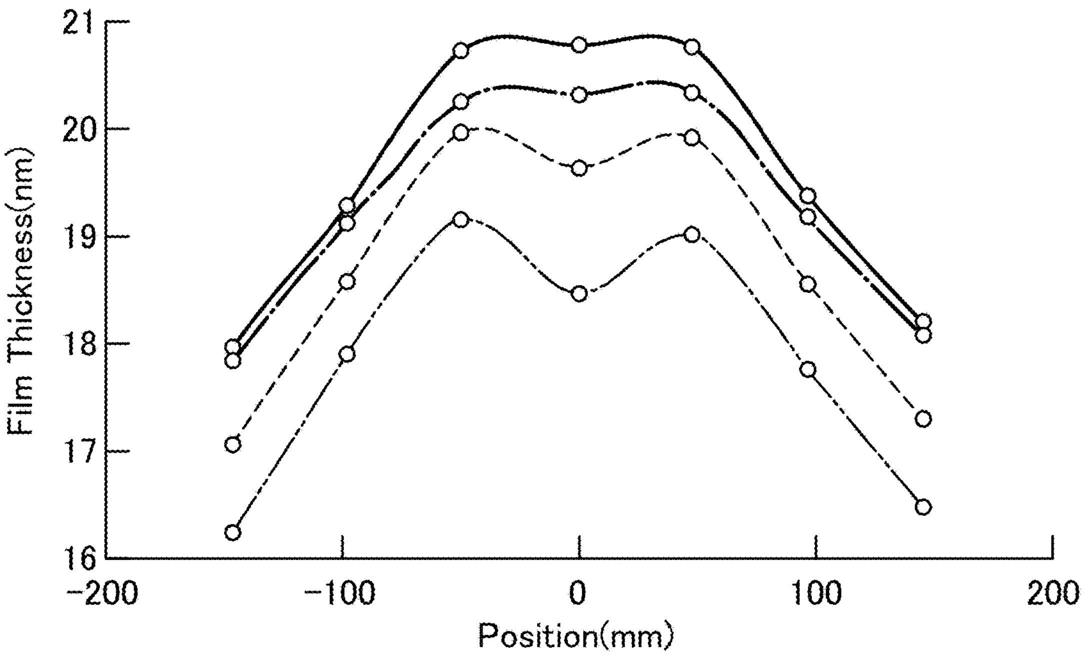
FIG. 2A is a graph showing a film thickness of a tungsten film obtained by the invention.
Figure 2B:
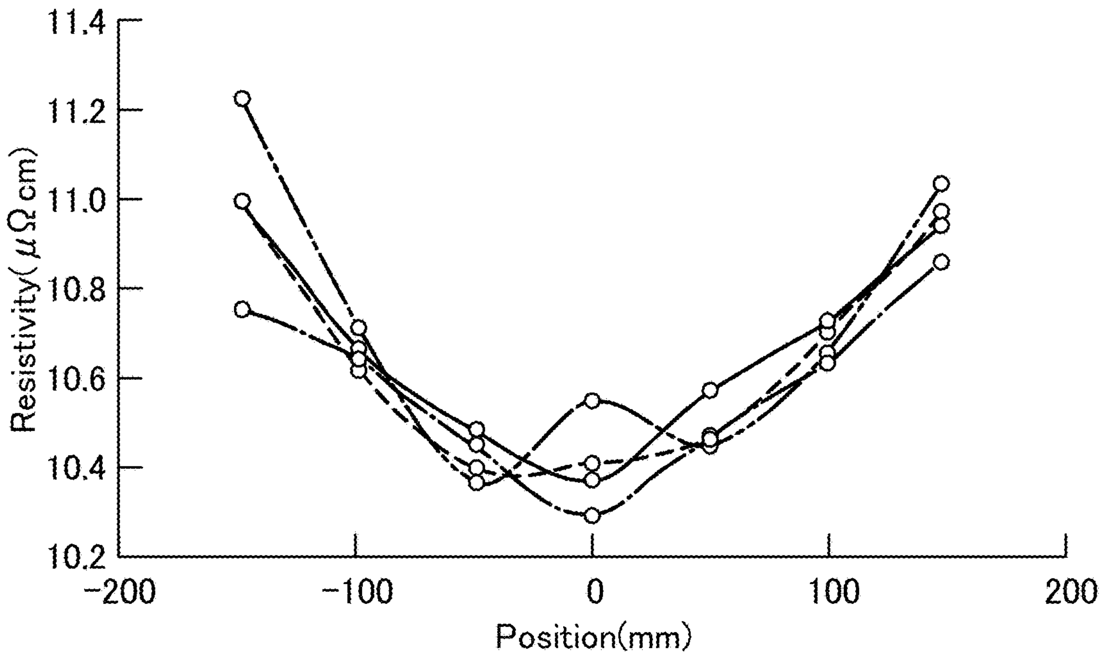
FIG. 2B is a graph showing a specific resistance value of the tungsten film obtained by the invention.

In order to confirm these effects, the following experiments were conducted using the above sputtering apparatus SM. In Invention Experiment No. 1, the area of the substrate holding surface 2*a* of the substrate stage 2 of the above sputtering apparatus SM, the surface area of the sputtering surface 3*a* of the target 3, the inner-surface area of the upper shield plate 5*u* facing the deposition space 1*a*, and the inner-surface area od the lower shield plate 5*d* facing the deposition space 1*a* were set to 660 $cm^2$, 1,520 $cm^2$, 562 $cm^2$, and 2,011 $cm^2$, respectively. In addition, the second surface portion 54*b* of the lower flat plate part 54 of the lower shield plate 5*d* is covered with the insulator 6 (1,143 $cm^2$), and the ratio of the anode area to the cathode area was set to 4.47. Then, an article in which a $SiO_2$ film was deposited over an entire surface of a silicon wafer of φ300 mm was made into the substrate Sw. Krypton gas was introduced into the vacuum chamber 1 at a flow rate of 46 sccm, and the DC power of 1.2 kW was supplied to the target 3 made of tungsten, the high-frequency electric power of 13.56 MHz and 450 W was supplied to the substrate stage 2, and thee tungsten film was deposited on the substrate Sw for 20 second. After deposition, the film thickness and resistivity of the obtained tungsten film were measured. In FIGS. 2A, 2B, an in-plane film thickness and an in-plane resistivity of the surface of the tungsten film obtained in Invention Experiment No. 1 were represented by a solid line, respectively. In addition, an average film thickness, an average resistivity, and a value divided by the average resistivity by the average film thickness of the tungsten film obtained in Invention Experiment No. 1 were 18.96 nm, 10.79 μΩcm, and 0.5691, respectively.

As Comparative Experiment to Invention Experiment No. 1, the tungsten film was deposited under the same conditions as in Invention Experiment except that the second surface portion 54*b* of the lower flat plate part 54 of the lower shield plate 5*d* was not covered with the insulator 6, the ratio of anode area to the cathode area was set to 6.20. After deposition, the film thickness and resistivity of the tungsten were measured. In FIGS. 2A, 2B, the in-plane film thickness and the in-plane resistivity of the surface of the tungsten film obtained in Comparative Experiment were represented by a single-pointed line. In addition, the average film thickness, the average resistivity, and the value divided by the resistivity by the average film thickness were 18.96 nm, 10.169 μΩcm, and 0.5698, respectively. According to the results, it was confirmed that the resistivity with respect to the film thickness, of which the tungsten film was obtained in Invention Experiment No.1, was reduced compared to Comparative Experiment (i.e., the resistivity became small when the film thickness of the tungsten film is the same).

In addition, as Invention Experiment No. 2, the tungsten film was deposited under the same conditions as in Invention Experiment No.1 except that an area of the insulator 6 covering the second surface portion 54*b* of the lower flat plate part 54 of the lower shield plate 5*d* was 130 $cm^2$, and the ratio of the anode area to the cathode area was set to 6.0. After deposition, the film thickness and resistivity of the tungsten were measured. It was confirmed that the resistivity with respect to the film thickness of the tungsten film obtained in Invention Experiment No. 2, similar to Invention Experiment No. 1, became small compared to Comparative Example.

Next, the high-frequency electric power supplied to the substrate stage 2 was appropriately changed under the same deposition conditions as in Invention Experiment No. 1, multiple tungsten films were deposited, and the film thickness and the resistivity of the obtained tungsten films were measured. In FIGS. 2A, 2B, the in-plane film thickness and the in-plane resistivity of the tungsten films obtained by supplying the high-frequency electric power of 500 W were represented by a dotted line (Invention Experiment No. 3). In addition, the average film thickness of the tungsten film obtained in Invention Experiment No. 3 was 18.10 nm and the average resistivity was 10.77 μΩcm. Furthermore, in FIGS. 2A, 2B, the in-plane film thickness and the in-plane resistivity of the tungsten film obtained by supplying the high-frequency electric power of 550 W were represented by a double chain line, respectively (Invention Experiment No. 4). Incidentally, the average film thickness of the tungsten film obtained in Invention Experiment No. 4 was 17.37 nm and the average resistivity was 10.88 μΩcm. From the results of Invention Experiment Nos. 1, 3, 4, it was confirmed that the resistivity of the tungsten film is little changed and that the film thickness is decreased by increasing the high-frequency electric power. In other words, for the same film thickness, increasing the high-frequency electric power reduces the resistivity.

Although the embodiment of the invention is described, various modifications are possible as long as they do not depart from the scope of the technical conception. In the embodiment, the article of the magnetron type is exemplified as a sputtering apparatus, but the sputtering apparatus is not limited to it, and the invention can be applied to those in which the first plasma atmosphere is generated by other conventional known methods. In addition, in the embodiment, the decrease of the anode area by covering the second surface portion 54*b* of the lower flat plate part 54 of the lower shield plate 5*d* is described as an example, but a method of decreasing the anode area is not limited thereto. For example, a part of the lower flat plate part 54 configuring the second surface portion 54*b* may itself be formed of an insulating material such as alumina and quartz. In addition, in the case where the second surface portion 54*b* is provided with the insulator 6, not only the foil-shaped (film-shaped) insulator 6 is adhered to the second surface portion 54*b*, but also a ring-shaped insulating plate may be mounted on the second surface portion 54*b*, or multiple insulating plates formed into a strip shape may be mounted on the second surface portion 54*b* without any clearance. Furthermore, although covering the inner-surface of the lower shield plate 5*d* with the insulator 6 in order to decrease the anode area is described as an example, the portion covered with the insulator 6 is not restricted thereto, and the inner-surface of the upper shield plate 5*u* may be covered with the insulator 6, for example.

EXPLANATION OF SYMBOLS

SM Sputtering apparatus
Hs High-frequency power source
Pm1 First plasma atmosphere
Pm2 Second plasma atmosphere
Sw Substrate (Substrate to be treated)
1 Vacuum chamber
1*a* Deposition space
2 Substrate stage
2*a* Substrate holding surface
3 Target
3*a* Sputtering surface
Us Shield unit
54 Lower flat plate part (Shield plate)
54*a* First surface portion
54*b* Second surface portion
6 Insulator

What is claimed is:

1. A sputtering apparatus, comprising:

a substrate stage holding a substrate to be treated in a vacuum chamber in which a target made of tungsten is mounted; and a high-frequency power source supplying a high-frequency electric power to the substrate stage, wherein the sputtering apparatus is configured that when a first plasma atmosphere of a rare gas is generated in the vacuum chamber of a vacuum atmosphere, and sputtered particles generated by sputtering the target are adhered and accumulated on the substrate to be treated held by a substrate holding surface of the substrate stage so that a tungsten film is deposited, a second plasma atmosphere of capacity-coupling type is generated in the vacuum chamber by supplying the high-frequency electric power to the substrate stage functioning as a first electrode, and plus ions ionized in the first plasma atmosphere are also caused to collide with the substrate to be treated, and wherein the sputtering apparatus further comprises a shield unit at a ground potential surrounding a deposition space between the target and the substrate stage, the shield unit functioning as a second electrode, and wherein the sputtering apparatus is further configured that provided that an area of the substrate holding surface of the substrate stage to which the high-frequency electric power is supplied is defined as a cathode area and an inner-surface area of the vacuum chamber and the shield unit functioning as the second electrode of the second plasma atmosphere is defined as an anode area, a ratio of the anode area to the cathode area is set in a range of 4.0 to 6.0, wherein the shield unit has a shield plate placed around the substrate stage, and in a surface of the shield plate facing the deposition space, a first surface portion disposed on a substrate stage side has a lower impedance than a second surface portion other than the first surface portion, and the second surface portion is covered with an insulator while the first surface portion remains exposed to the deposition space, such that the anode area is reduced by excluding an area corresponding to the second surface portion from the anode area while maintaining an area corresponding to the first surface portion in the anode area.

2. A deposition method of a tungsten film, comprising:

a step of introducing a rare gas into a vacuum chamber in which a target made of tungsten is mounted, generating a first plasma atmosphere of the rare gas in the vacuum chamber of a vacuum atmosphere by supplying an electric power to the target, scattering sputtered particles generated by sputtering a sputtering surface of the target, and depositing a tungsten film by adhering and accumulating the sputtered particles on a substrate to be treated held by a substrate stage; and a step, during deposition, of supplying a high-frequency electric power to the substrate stage functioning as a first electrode and generating a second plasma atmosphere of a capacity-coupling type in the vacuum chamber, and also causing ions ionized in the first plasma atmosphere to collide with the substrate to be treated, wherein, when the second plasma atmosphere is generated, a shield unit at a ground potential surrounding a deposition space between the target and the substrate stage functions as a second electrode, wherein provided that an area of a substrate holding surface of the substrate stage to which the high-frequency electric power is supplied is defined as a cathode area and an inner-surface area of the vacuum chamber and the shield unit functioning as the second electrode of the second plasma atmosphere is defined as an anode area, the deposition method of the tungsten film further comprises a step of adjusting a self-bias potential that is a negative DC component of a potential of the substrate to be treated independently of the high-frequency electric power supplied to the substrate stage by changing a ratio of the anode area to the cathode area in a range of 4.0 to 6.0, wherein, in a surface of a shield plate of the shield unit facing the deposition space, a first surface portion disposed on a substrate stage side has a lower impedance than a second surface portion other than the first surface portion, and the second surface portion is covered with an insulator while the first surface portion remains exposed to the deposition space, such that the anode area is reduced by excluding an area corresponding to the second surface portion from the anode area while maintaining an area corresponding to the first surface portion in the anode area.

* * * * *